United States Patent [19]

Hsue et al.

[11] Patent Number: 5,436,185
[45] Date of Patent: Jul. 25, 1995

[54] METHOD OF FABRICATING A ROM DEVICE WITH A NEGATIVE CODE IMPLANT MASK

[75] Inventors: Chen-Chiu Hsue; Gary Hong, both of Hsin-Chu, Taiwan

[73] Assignee: United Microelectronics Corporation, Hsinchu, Taiwan

[21] Appl. No.: 289,647

[22] Filed: Aug. 12, 1994

[51] Int. Cl.[6] .................................... H01L 21/265
[52] U.S. Cl. ............................ 437/48; 437/45; 437/52
[58] Field of Search ................... 437/47–48, 437/44, 52, 45; 257/290–292

[56] References Cited

U.S. PATENT DOCUMENTS

| | | | |
|---|---|---|---|
| 4,356,042 | 10/1982 | Gredaly et al. | 437/52 |
| 4,364,167 | 12/1982 | Donley | 437/52 |
| 5,278,078 | 1/1994 | Kanebako | 437/29 |

*Primary Examiner*—Olik Chaudhuri
*Assistant Examiner*—H. Jey Tsai

*Attorney, Agent, or Firm*—George O. Saile; Graham S. Jones, II

[57] ABSTRACT

A semiconductor ROM device on a semiconductor substrate includes an array of parallel bit lines oriented in a first direction. A blanket word line layer formed on the device is covered with a word line mask with word line patterns orthogonal to the bit lines used during etching of word line layer to form word lines. A blanket glass layer is formed over the device and then covered with a patterned negative negative code implant mask. A silicon dioxide layer is formed on the blanket glass layer around the patterned negative negative code implant mask. The negative negative code implant mask is removed leaving a ROM code opening through the silicon dioxide layer, whereby the silicon dioxide layer forms a ROM code implant mask. The ROM code opening is centered on a word line conductor, and a code ion implant of dopant is made through the ROM code opening forming a code implant doped region in the substrate below the word line. The silicon dioxide layer is formed by liquid phase deposition.

9 Claims, 5 Drawing Sheets

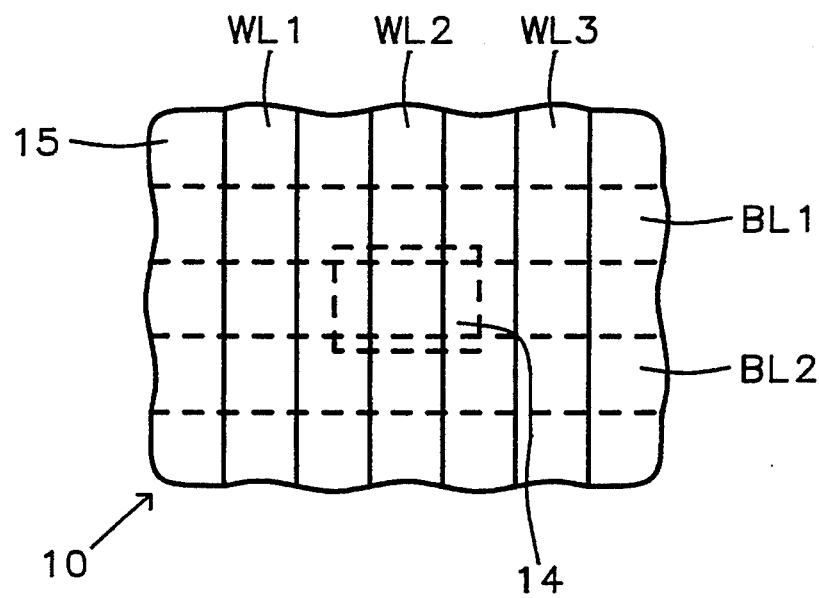
FIG. 1 — Prior Art
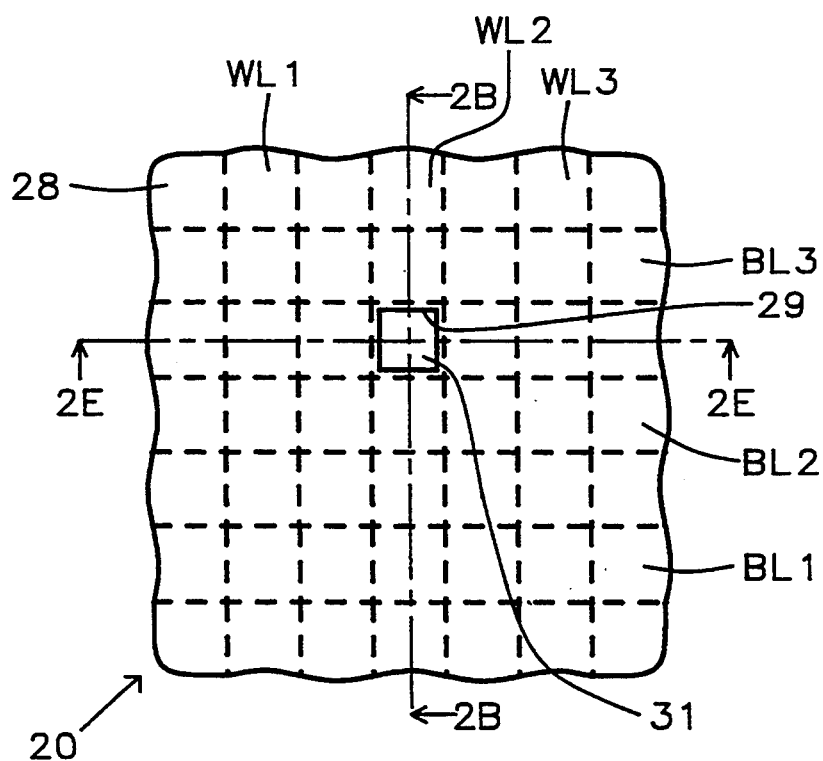
FIG. 2A

METHOD OF FABRICATING A ROM DEVICE WITH A NEGATIVE CODE IMPLANT MASK

BACKGROUND OF THE INVENTION

1. Field of the Invention

This invention relates to semiconductor memory devices and more particularly to memory devices with an improved ROM code region.

2. Description of Related Art

FIG. 1 is a schematic plan view of a prior art ROM device comprising a semiconductor substrate coated with a gate oxide layer 15, with an array of bit lines BL1 and BL2 and with an array of word lines WL1, WL2, and WL3 passing over the tops of the bit lines BL1 and BL2. A ROM code implant region 14 is located within the space under a particular word line WL2 at its intersection with two adjacent bit lines BL1 and BL2.

The problem with the prior art process of FIG. 1 is that the side diffusion of dopant from ROM code implant 14 causes extension into the non-active area between the particular word line WL2 (where the ROM code location belongs) and adjacent word lines WL1 and WL3, as shown in FIG. 1.

SUMMARY OF THE INVENTION

In accordance with this invention a method is provided for manufacturing a semiconductor ROM device on a semiconductor substrate with an array of parallel bit lines integral therewith, the bit lines being oriented in a first direction, the method comprising the steps of forming a blanket word line conductive layer on the device, forming a word line mask over the word line conductive layer, the word line mask including word line patterns oriented orthogonally to the direction of the array of bit lines, etching the word line conductive layer through the word line mask to form word lines therefrom, forming a blanket glass layer on the device, forming a patterned negative code implant mask over the blanket glass layer, forming a silicon dioxide layer on the blanket glass layer around the patterned negative code implant mask, removing the negative code implant mask leaving a ROM code opening through the silicon dioxide layer, whereby the silicon dioxide layer forms a ROM code implant mask, the ROM code opening being centered on a first one of the array of word line conductors, and ion implanting a code implant of a dopant through the ROM code opening to form a code implant doped region in the substrate below the word line.

Preferably, the silicon dioxide layer is formed by liquid phase deposition, with the silicon dioxide layer having a thickness within a range of from about 3,000 Å to 6,000 Å; the ROM code implant dopant comprising boron implanted at an energy of about 160 keV at a dose of about $1 \times 10^{14}/cm^2$; the word line conductive layer has a thickness within a range of from about 2,000 Å to 4,000 Å; the word line conductive layer consisting of a material selected from polysilicon and polycide having a thickness within a range of from about 2,000 Å to 4,000 Å, the liquid phase deposition silicon dioxide layer has a thickness within a range of from about 3,000 Å to 6,000 Å, and the ROM code implant dopant comprises boron implanted at an energy of about 160 keV at a dose of about $1 \times 10^{14}/cm^2$.

In accordance with another aspect of this invention, a method of manufacturing a ROM semiconductor device formed on a lightly doped silicon substrate with an array of buried bit lines therein, which comprises the steps of forming a gate oxide layer on the surface of the substrate, forming a blanket word line conductive layer on the gate oxide layer, the word line conductive layer consisting of a material selected from polysilicon and polycide, forming a word line mask over the word line conductive layer, the word line mask including word line patterns oriented orthogonally to the bit lines, and the word line conductive layer having a thickness within a range of from about 2,000 Å to 4,000 Å, etching the word line conductive layer through the word line mask to form word lines therefrom, forming a blanket glass layer on the device, forming a patterned negative code implant mask over the blanket glass layer, forming a silicon dioxide layer on the blanket glass layer around the patterned negative code implant mask, removing the negative code implant mask leaving a ROM code opening through the silicon dioxide layer, whereby the silicon dioxide layer forms a ROM code implant mask, the ROM code opening being centered on a first one of the array of word line conductors, and ion implanting a code implant of a boron dopant through the ROM code opening at an energy of about 160 keV at a dose of about $1 \times 10^{14}/cm^2$ to form a code implant doped region in the substrate below the word line.

Preferably, the blanket silicon dioxide layer comprises a blanket layer formed by liquid phase deposition having a thickness within a range of from about 3,000 Å to 6,000 Å.

In accordance with still another aspect of the invention, a ROM semiconductor device is formed on a lightly doped silicon substrate with an array of parallel bit lines integral therewith, the bit lines being oriented in a first direction, comprising a parallel array of word line conductors formed over the device oriented orthogonally relative to the bit lines, a blanket glass layer over the device including the word line conductors, a silicon dioxide layer formed on the blanket glass layer comprising a ROM code implant mask, the ROM code opening being centered on a first one of the array of word line conductors, and a code implant of a dopant ion implanted through the ROM code opening in a code implant doped region in the substrate below the word line.

Preferably, the silicon dioxide layer comprises a liquid phase deposition silicon dioxide material having a thickness within a range of from about 3,000 Å to 6,000 Å; the ROM code implant dopant comprises boron implanted with a dose of about $1 \times 10^{14}/cm^2$; the word line conductive layer consists of a material selected from polysilicon and polycide having a thickness within a range of from about 2,000 Å to 4,000 Å; the blanket silicon dioxide layer comprises a blanket liquid phase deposition silicon dioxide layer having a thickness within a range of from about 3,000 Å to 6,000 Å.

BRIEF DESCRIPTION OF THE DRAWINGS

The foregoing and other aspects and advantages of this invention are explained and described below with reference to the accompanying drawings, in which:

FIG. 1 is a schematic plan view of a prior art ROM device.

FIG. 2A shows a schematic plan view of a device comprising an embodiment of this invention.

FIGS. 2B-2D are sectional views of the device of FIG. 2A taken along line 2B—2B in FIG. 2A showing cross sections of several buried bit lines and a section of the word line layer.

FIGS. 2E-2K are sectional views of the device of FIG. 2A taken along line 2E—2E in FIG. 2A showing the sequence of process steps for manufacture of a device in accordance with this invention.

DESCRIPTION OF THE PREFERRED EMBODIMENT

In accordance with this invention, a LPD (Liquid Phase Deposition) process is employed to form a ROM code implant mask which can be smaller than the width of the word lines. Therefore, the adjacent on-cell will not be affected by the misalignment and/or dopant (boron) side diffusion.

Figure 2B:
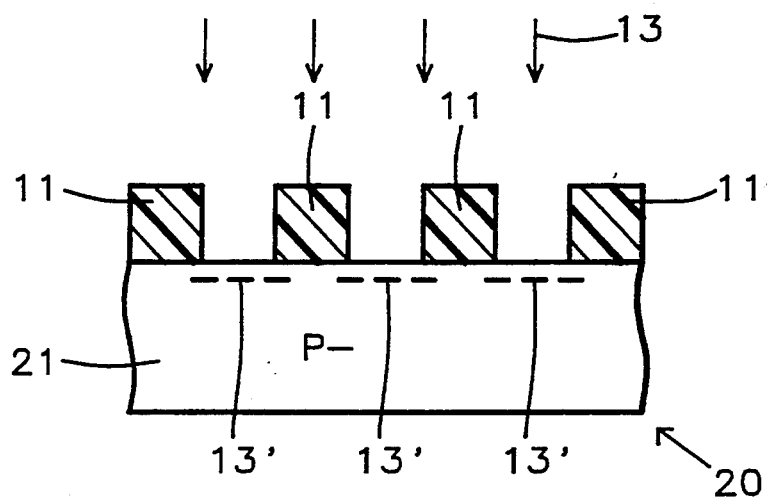
FIGS. 2B-2K show the process flow for a method of manufacture of the device of FIG. 2A.

FIGS. 2A shows a device in accordance with this invention and FIGS. 2B-2K show a method of making the device shown in FIG. 2A.

FIG. 2A shows a schematic plan view of a ROM device 20 in accordance with this invention. Device 20 includes an array of buried bit lines BL1, BL2, and BL3 and an orthogonally oriented array of word lines WL1, WL2, and WL3 lines passing over the tops of the bit lines BL1, BL2, and BL3, substantially at right angles thereto. A ROM code implant 31 is located within the space under a particular word line WL2 at its intersection with bit lines BL2 and BL3. The word lines WL1, WL2, and WL3 are covered by a silicon dioxide ($SiO_2$) layer 26 as shown in FIGS. 2F-2I, which layer 26 is coated in turn by another, LPD (liquid phase deposition), silicon dioxide ($SiO_2$) layer 28 as shown in FIG. 2A and FIGS. 2G-2I.

FIG. 2B is a sectional view of the device 20 of FIG. 2A taken along line 2B—2B in FIG. 2A showing cross sections of device 20 in an early stage of manufacture with the P− substrate 21 covered with a conventional bit line photoresist mask 11, which is being exposed to conventional ion implantation of arsenic ions 13 to provide an array of N+ implanted regions 13′ in P− substrate 21.

Figure 2C:
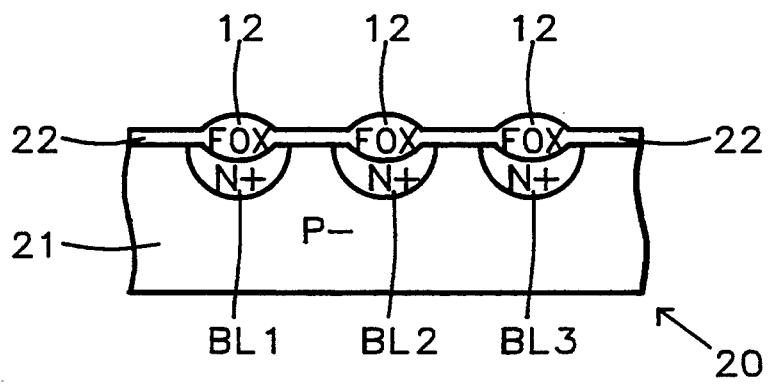

FIG. 2C shows the device 20 of FIG. 2B after the photoresist mask 11 has been stripped by a well known conventional technique. The surface of device 20 is then oxidized to form gate oxide layer 22 and FOX (field oxide) regions 12. The gate layer 22 and FOX regions 12 are formed in a blanket oxidation process preferably employing dry oxidation at 900° C. or a well-known conventional method to provide gate oxide layer 22 over the P-substrate 21, and (FOX) regions 12 over the N+ implanted regions 13′. The gate oxide layer 22 has a thickness within the range from about 100 Å to about 200 Å. The FOX regions 12 have a thickness within the range from about 300 Å to about 1,000 Å.

In addition, below the FOX regions 12 a parallel array of several buried bit lines BL1, BL2, and BL3 are formed from the N+ implanted regions 13′ in the P− doped silicon substrate 21.

Figure 2D:
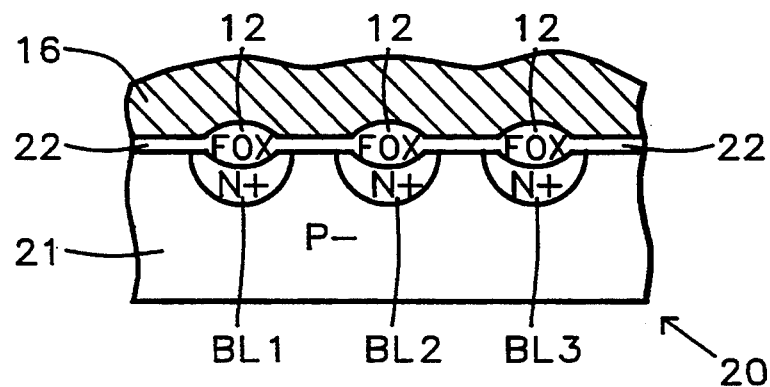

Referring to FIG. 2D the device of FIG. 2C is shown after the gate oxide layer 22 and FOX regions 12 are coated with a blanket layer 16 comprising a word line layer 16 of polycrystalline silicon containing (polysilicon 1 or polycide 1) with a thickness within the range from about 2,000 Å to about 4,000 Å. The polysilicon 1 or polycide 1 word line layer 16 is formed using a conventional method, e.g. LPCVD.

Figure 2E:
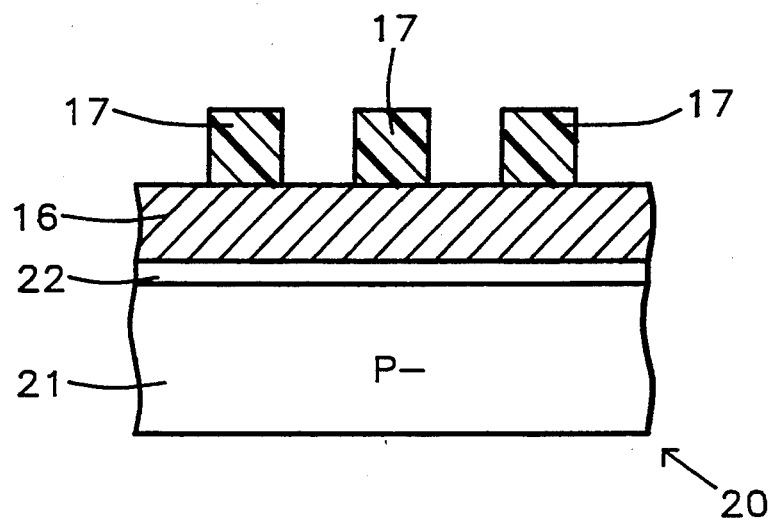

FIGS. 2E-2K are sectional views of the device of FIG. 2A taken along line 2E—2E in FIG. 2A showing the sequence of process steps for manufacture of a device in accordance with this invention. FIG. 2E shows the device of FIG. 2D from a different perspective in a different sectional view after a step of manufacture subsequent to that shown by FIG. 2D. The FIG. 2E section is taken across the blanket word line layer 16, between bit lines BL2 and BL3. A blanket layer of photoresist 17 has been applied above word line layer 16 and exposed with a pattern of strips by photolithographic exposure forming photoresist mask 17 in the configuration of the parallel strips of word lines to be formed in the word line layer 16. Then the mask 17 serves as a mask for etching the word line layer 16 to remove portions thereof between the stripes of mask 17 producing the word lines WL1, WL2, and WL3 as shown in FIG. 2D.

Figure 2F:
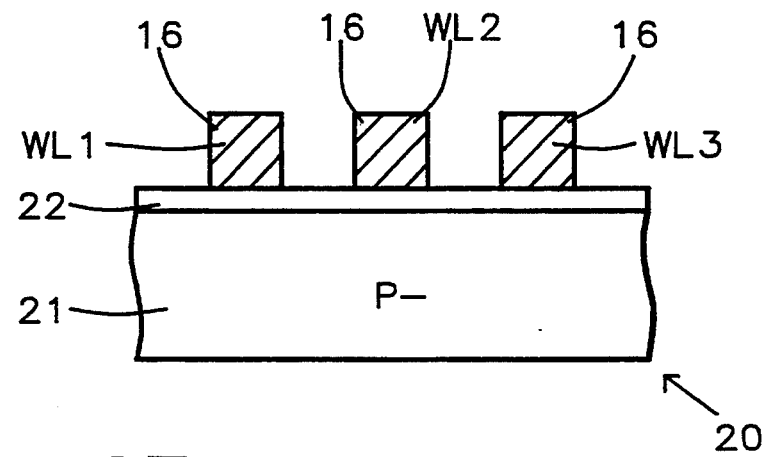

FIG. 2F shows the device of FIG. 2E after formation of word lines WL1, WL2, and WL3. In addition, after the etching step, mask 17 has been stripped from the array of word lines WL1, WL2, and WL3 (shown in FIG. 2A) which have been shaped by the etching step in FIG. 2E.

Figure 2G:
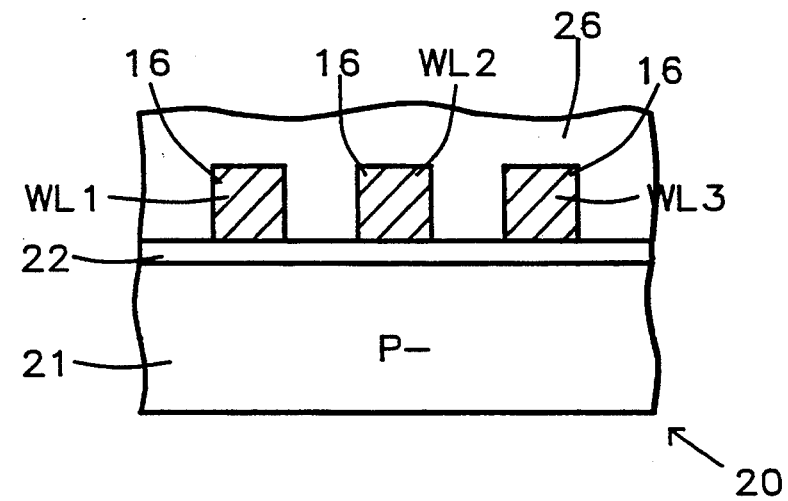

Next as shown in FIG. 2G, a silicon dioxide ($SiO_2$) "oxide" glass layer 26 is applied above word line layer 16 providing a dielectric layer 26. "Oxide" ($SiO_2$) layer 26 is deposited to a thickness from about 2,000 Å to about 4,000 Å by a low temperature CVD process at a temperature of between about 250° C. and about 350° C. by CVD (chemical vapor deposition) from gases selected from the group consisting of silane ($SiH_4$) and oxygen ($O_2$.)

Figure 2H:
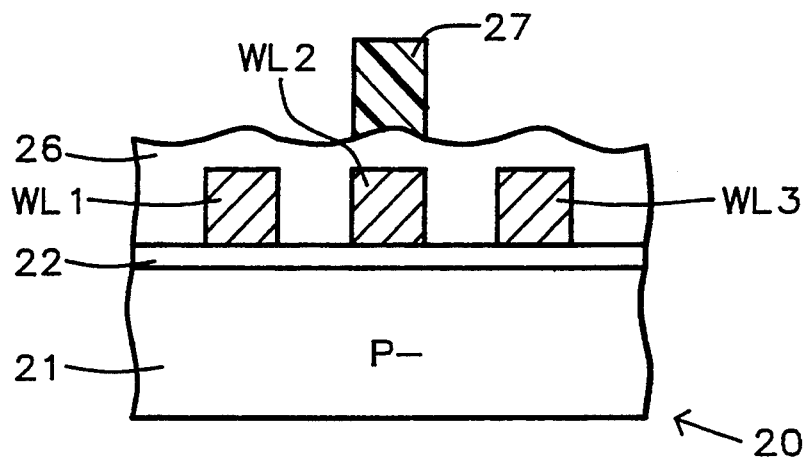

FIG. 2H shows the product of FIG. 2G after a blanket coating of a photoresist layer 27 has been applied to the device 20 shown in FIG. 2G, and photolithographically exposed to form a negative code implant pattern leaving the developed photoresist negative code implant mask 27 covering the region into which a code implant is to be made, later. It is easier to form the undersized ROM code patterns in photoresist mask 27, as contrasted with opening of window patterns by subtractive (etching) techniques. The ROM code pattern opening 29 to be formed later as shown in FIG. 2H can be smaller, i.e. narrower, than the wordlines WL1, WL2, and WL3.

Figure 2I:
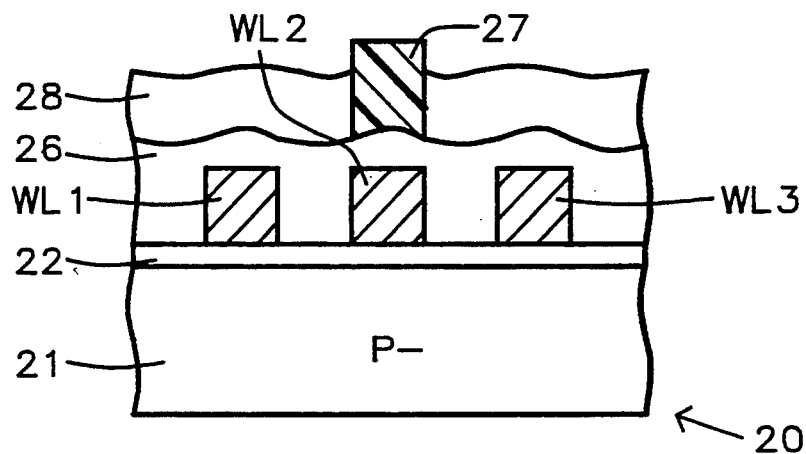

In FIG. 2I the device of FIG. 2H has been coated in a chamber using an LPD (Liquid Phase Deposition) process to deposit of the silicon dioxide layer 28 having a thickness within the range from about 3,000 Å to about 6,000 Å, leaving the top of photoresist ROM negative code implant mask 27 pattern extending above the silicon dioxide ($SiO_2$) "oxide" layer 28.

Figure 2J:
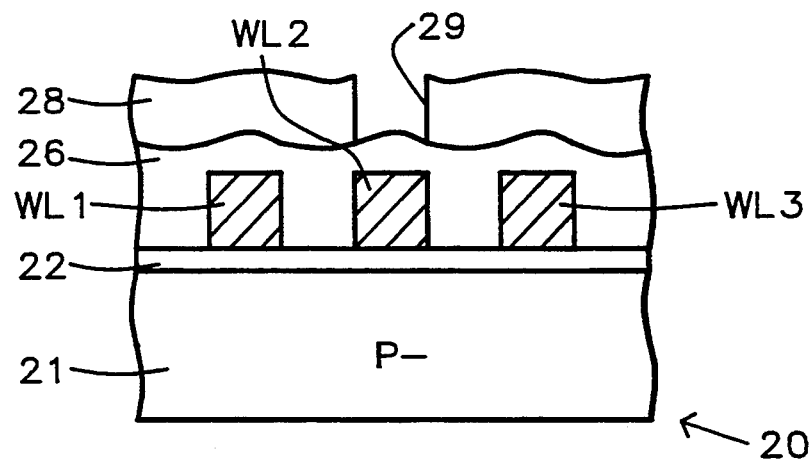

In FIG. 2J, the device of FIG. 2I is shown in a stage of manufacture in which, prior to an ion implantation, the photoresist negative code implant mask 27 has been stripped away leaving ROM code opening 29 in silicon dioxide (SiO$_2$) "oxide" layer 28 above word line WL2 between bit lines BL2 and BL3 as shown in FIG. 2A.

Figure 2K:
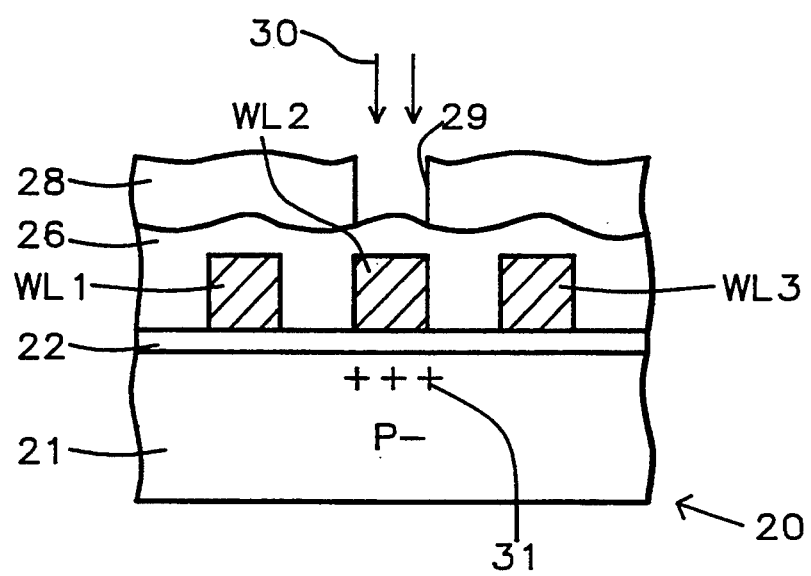

In FIG. 2K, the device of FIG. 2J is shown with a ROM code ion implant of boron B+ ions 30 being implanted through the ROM code opening 29 down through a thin portion of the BPSG layer 26, through the word line WL2 and gate oxide layer 22 to form the ROM code implant 31 in the P-substrate 21 in a region 31 which is self-aligned with the polysilicon word line WL2. The chemical species of the dopant implanted is boron with a dose of $1 \times 10^{14}/cm^2$ implanted at an energy of about 160 keV.

Subsequently, the LPD oxide layer 28 remains as a part of the passivation of the device on top of glass layer 26.

Note that this process can be employed after metal deposition, as there is no metal in the ion implantation regions.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacturing a ROM semiconductor device formed on a semiconductor substrate with an array of parallel buried bit lines integral therewith, said bit lines being oriented in a first direction, said method comprising the steps of forming a blanket word line conductive layer on said device, forming a word line mask over said word line conductive layer, said word line mask including word line patterns oriented orthogonally to the direction of said array of bit lines, etching said word line conductive layer through said word line mask to form word lines therefrom, forming a blanket glass layer on said device, forming a patterned negative code implant mask over said blanket glass layer, forming a blanket silicon dioxide layer on said blanket glass layer around said patterned negative code implant mask, removing said negative code implant mask leaving a ROM code opening through said silicon dioxide layer, whereby said silicon dioxide layer forms a ROM code implant mask, said ROM code opening being centered on a first one of said word line conductors, and ion implanting a code implant of a dopant through said ROM code opening to form a code implant doped region in said substrate below said word line.

2. The method of claim 1 wherein said silicon dioxide layer is formed by liquid phase deposition, said silicon dioxide layer having a thickness within a range of from about 3,000 Å to 6,000 Å.

3. The method of claim 1 wherein said ROM code implant dopant comprises boron implanted at an energy of about 160 keV at a dose of about $1 \times 10^{14}/cm^2$.

4. The method of claim 1 wherein said blanket silicon dioxide layer formed on said blanket glass layer is formed by liquid phase deposition.

5. The method of claim 4 wherein said blanket silicon dioxide layer formed on said blanket glass layer by liquid phase deposition has a thickness within a range of from about 3,000 Å to 6,000 Å.

6. The method of claim 5 wherein said word line conductive layer has a thickness within a range of from about 2,000 Å to 4,000 Å.

7. The method of claim 6 wherein said word line conductive layer consists of a material selected from polysilicon and polycide having a thickness within a range of from about 2,000 Å to 4,000 Å, said liquid phase deposition silicon dioxide layer has a thickness within a range of from about 3,000 Å to 6,000 Å, and said ROM code implant dopant comprises boron implanted at an energy of about 160 keV at a dose of about $1 \times 10^{14}/cm^2$.

8. A method of manufacturing a ROM semiconductor device formed on a lightly doped silicon substrate with an array of buried bit lines therein, which comprises the steps of forming a gate oxide layer on the surface of said substrate, forming a blanket word line conductive layer on said gate oxide layer, said word line conductive layer consisting of a material selected from polysilicon and polycide, forming a word line mask over said word line conductive layer, said word line mask including word line patterns oriented orthogonally to said bit lines, and said word line conductive layer having a thickness within a range of from about 2,000 Å to 4,000 Å, etching said word line conductive layer through said word line mask to form word lines therefrom, forming a blanket glass layer on said device, forming a patterned negative code implant mask over said blanket glass layer, forming a silicon dioxide layer on said blanket glass layer around said patterned negative code implant mask, removing said negative code implant mask leaving a ROM code opening through said silicon dioxide layer, whereby said silicon dioxide layer forms a ROM code implant mask, said ROM code opening being centered on a first one of said word line conductors, and ion implanting a code implant of a boron dopant through said ROM code opening at an energy of about 160 keV at a dose of about $1 \times 10^{14}/cm^2$ to form a code implant doped region in said substrate below said word line.

9. The method of claim 8 wherein said blanket silicon dioxide layer formed on said blanket glass layer by liquid phase deposition has a thickness within a range of from about 3,000 Å to 6,000 Å.

* * * * *